United States Patent [19]

Feldstein

[11] 4,293,591
[45] * Oct. 6, 1981

[54] PROCESS USING ACTIVATED ELECTROLESS PLATING CATALYSTS

[76] Inventor: Nathan Feldstein, 63 Hemlock Cir., Princeton, N.J. 08540

[*] Notice: The portion of the term of this patent subsequent to Sep. 13, 1994, has been disclaimed.

[21] Appl. No.: 135,237

[22] Filed: Mar. 31, 1980

Related U.S. Application Data

[60] Continuation-in-part of Ser. No. 105,865, Feb. 21, 1979, which is a division of Ser. No. 941,044, Sep. 11, 1978, Pat. No. 4,180,600, which is a continuation-in-part of Ser. No. 820,904, Aug. 1, 1977, Pat. No. 4,131,699, which is a continuation of Ser. No. 625,326, Oct. 23, 1975, Pat. No. 4,048,354.

[51] Int. Cl.$^3$ .............................................. C23C 3/02
[52] U.S. Cl. ........................................ 427/97; 427/98; 427/304; 427/306
[58] Field of Search ................. 427/304, 305, 306, 97, 427/98

[56] References Cited

U.S. PATENT DOCUMENTS

| | | | |
|---|---|---|---|
| 4,048,354 | 9/1977 | Feldstein | 427/306 |
| 4,131,699 | 12/1978 | Feldstein | 427/304 |
| 4,180,600 | 12/1979 | Feldstein | 427/304 |

Primary Examiner—Ralph S. Kendall

[57] ABSTRACT

A process and method for the formation of novel colloidal catalytic electroless plating compositions comprising the admixture of at least one primary colloid stabilizer which otherwise renders the colloidal dispersion highly stable however weakly active with at least one secondary colloid stabilizer (or reactivity modifier) thereby activating the colloidal dispersion to a more active state when used in the catalytic treatment of non-conductors prior to electroless (chemical) plating.

10 Claims, No Drawings

PROCESS USING ACTIVATED ELECTROLESS PLATING CATALYSTS

REFERENCE TO PRIOR APPLICATIONS:

This application is a continuation-in-part of application Ser. No. 105,865 filed Feb. 21, 1979 which is a divisional application of Ser. No. 941,044 filed Sept. 11, 1978, now U.S. Pat. No. 4,180,600 which is a continuation-in-part of U.S. application Ser. No. 820,904 filed Aug. 1, 1977 now U.S. Pat. No. 4,131,699 which is a continuation of U.S. application Ser. No. 625,326 filed on Oct. 23, 1975, now U.S. Pat. No. 4,048,354.

BACKGROUND OF THE INVENTION

In the plating of dielectric (non-conductor) substrates by chemical (electroless) plating, it is well known that suitable catalytic treatment is a prerequisite for effective electroless metal deposition. Such practices are well known and accepted in the art.

In examining the prior art for catalytic pretreatment, it appears that while different procedures have been used, the incorporation of precious metals (e.g., palladium containing solutions) was common to all procedures. One catalytic system of particular interest is the two step process as disclosed in U.S. Pat. No. 3,011,920. In the process disclosed, a colloidal solution composed of tin (II) and precious metal salts, generally with hydrochloric acid, is used. The effective catalyst is proposed to be a colloid of an elemental precious metal (e.g., palladium) stabilized by the excess stannous chloride present in the medium. While the system disclosed in U.S. Pat. No. 3,011,920 has been quite popular in commercial practices, rising costs of precious metals and miscellaneous product reliability problems have led to the quest for new systems in which the use of precious metals, tin, as well as that of the hydrochloric acid would be completely eliminated.

In meeting this objective it was found, as described in U.S. Pat. Nos. 3,993,799 and 4,087,586 filed by the applicant herein, that colloidal systems (metals, alloys, and compounds) based upon non-precious metals could constitute the basis for new commercial plating processes. It was found that colloids of non-precious metals preferably selected from, but not limited to, the group of copper, iron, cobalt, nickel and combinations thereof) may be used in the replacement of the tin/palladium colloid followed by a treatment in a suitable reducing medium. In the reducing medium, reduction of the ionic portion of adduct (or surface of colloid) derived through the adsorption from the colloidal medium takes place, resulting in active nucleating sites capable of initiation of the electroless process. It is noted, however, that the reducing medium can be deleted since most electroless plating baths contain at least one reducing agent. Accordingly, the present invention is applicable to both modes of processing.

In reviewing the teaching disclosed in U.S. Pat. No. 3,993,799, it is recognized that many of the inherent disadvantages associated with the palladium based catalysts are eliminated. It is further recognized that based upon practices in this art, it is essential that any catalytic system should maintain its properties especially with storage (e.g. several months) and shipment under conditions of substantial temperature fluctuations. It is thus highly desirable to have a medium in which good colloidal stability would be maintained, and at the same time sufficient catalytic activity to be used in the plating process. I have generally observed that as one increases the stability, the activity for plating initiation is decreased thereby making it difficult to meet both requirements in a single system.

For example, I have observed that active plating colloids have generally shown a limited stability (for long term storage purposes) due to coagulation which takes place leading to precipitation, with change in particle size distribution during the coagulation process. In addition, I have noted that highly stable colloidal dispersions have shown limited catalytic activity when used in accordance with U.S. Pat. No. 3,993,799 and moderate concentrations of reducing medium or activating medium. Similar trends were also noted in U.S. Pat. No. 3,948,048 on the interrelationship between reactivity and stability. In fact, in U.S. Pat. No. 3,958,048 some of the illustrated examples lost their colloidal character and became true solutions within 24 hours of aging.

It is thus an objective of this invention to provide both stable and active colloidal dispersions which are useful in electroless plating processes as well as in other processes having the same prerequisites. While not wishing to be repititious, the following are included herein by reference: U.S. Pat. Nos. 3,011,920, 3,993,799, 3,958,048, 3,993,491, 3,993,801, 4,087,586, 4,180,600, 4,131,699, 4,167,596, 4,151,311, 4,132,832, 4,136,216 and applications 651,507, 938,890.

SUMMARY OF THE INVENTION

A method of preparing a novel catalytic colloidal composition useful in electroless plating techniques comprises the step of admixing a highly stable non-active (weakly active) colloidal dispersion with a reactivity modifier. Novel catalytic colloidal compositions prepared as above comprise stable colloids of preferably non-precious metals admixed with a reactivity modifier. The final admixture (colloidal product) is thus comprised of at least two distinct chemicals which are inherently colloid stabilizers. The novel catalytic colloidal compositions are utilized in the electroless plating process which comprises the steps of treating a dielectric substrate with the active catalytic colloidal composition and then, when necessary, further treating the substrate with a reducing or activating composition to provide additional active nuclei on the substrate surface, or to reduce the induction time for plating initiation. The activated substrate is then contacted with an electroless plating bath, and preferably a bath which is compatible. While it is generally preferred to admix a colloidal dispersion with at least one reactivity modifier, in an alternate approach the reactivity modifier may be admixed with the primary stabilizer (which alone renders the colloids weakly active) prior to the colloid nucleation process.

DETAILED DESCRIPTION OF THE INVENTION

The process of the present invention is applicable to the metallic plating of dielectric substrates by autocatalytic or, as more commonly known, electroless plating. Such processes are well known in the art and they produce a wide variety of products varying from printed circuitry arrays, decorative plated plastic parts and magnetic tapes to metallized fibers.

The term "hydrous oxide" as used herein is intended to encompass the insoluble oxides and insoluble hydroxides of metals. The preferable hydrous oxides are selected from the group consisting of oxides and hydroxides of cobalt, nickel, iron and copper and mixtures thereof. Other suitable hydrous oxides include oxides and hydroxides of precious metals such as palladium, silver and others.

It is also recognized that metallic colloids, (e.g. colloids of copper and nickel as well as alloys thereof) due to their pyrophoric nature oxidize when in contact with air and water. Therefore, they are really metallic nuclei with an outer oxidized surface and thus are also considered herein as hydrous oxide colloids. In addition, colloidal metallic nuclei of precious metals, while they are more inert towards oxidation, are also suitable in the practice of the present invention.

The term "stabilizer" as used herein is intended to encompass substances (chemicals) which alter the characteristics of the colloid so as to prevent, delay, or minimize their coagulation and precipitation. It is believed that these stabilizers are adsorbed and/or absorbed onto the surface of the colloids thereby altering the surface charge and hence their stability. Stabilizers contemplated by the present process and solution may include but are not limited to secondary colloids (gelatin), dispersants, surfactants, sugars and polyalcohols (glycerol).

The term "surfactant" (or surface active agent) as used herein generally refers to substances which are capable of lowering the surface tension of a liquid or the interfacial tension between two liquids. All useful surfactants possess the common feature of a water-soluble (hydrophilic) group attached to an organic (hydrophobic) chain. Surfactants as used herein are also intended to encompass detergents, dispersants, and emulsifying agents regardless of whether or not they lower the surface tension of a liquid (e.g. water).

The term "reactivity modifier(s)" as used in the present invention generally refers to substances which while alone are generally inert in said plating process, promote activation of the otherwise weakly active colloids in the plating process (the catalytic preparation). Such modifiers may be of organic or inorganic nature as well as combinations thereof. It should be recognized by those skilled in the art that the preferred reactivity modifier composition to be added and the quantity thereof is best determined as a trial procedure for each stable colloid composition and/or substrate to be coated. Furthermore, it should be recognized that reactivity modifier(s) are also inherently colloid stabilizers. Thus, the selection for such potential members is endless and should be obvious to one skilled in the art in view of the present invention.

I have also recognized that the reactivity modifier(s) can be selected from the class of nonionic surfactants. This class is particularly useful as the surfactant is neutrally charged, and hence its incorporation does not increase the ionic strength for the dispersion or affect the inherent charge of the colloids with the dispersion.

In general, the electroless plating process of the present invention comprises the steps of (1) contacting (priming) the substrate (preferably one which was previously cleaned and etched to promote adhesion) with a colloidal catalytic composition, (2) developing or activating the substrate further by contacting the substrate with a reducing agent (or activating agent) to form a discontinuous layer of the metal either in a reduced oxidation state or in a more activated or configuration state, thus forming the catalytic nuclei active for the initiation of the electroless plating, (which step, however, may be optional), and (3) contacting the substrate with a compatible electroless plating formulation. In step (2) when implemented, it is recognized that any of the several chemical reactions may take place (e.g., dissolution or removal of some of the colloidal stabilizer(s) or removal of weakly adsorbed colloid(s)), all of which provide a more active site(s) with shorter induction time for the electroless plating build-up. It is also noted that rinsing with a solvent and preferably water between key steps is considered good practice. In the above catalytic treatment, when employing colloidal dispersions comprising precious or non-precious metals in their elemental state, or alloys or compounds of said metals, sufficient activation of the substrate may be accomplished at the priming step without requiring the additional activation with a separate reducing or activating composition prior to contacting the substrate with the electroless plating bath.

The following examples are illustrative of the concept of the present invention and are not to be taken as in limitation thereof; moreover, it should be obvious to those skilled in the art that further optimization is possible for compositions and conditions yielding less than 100% coverage. Furthermore, it should be obvious that the present findings are not limited to the art of plating and they can be used in other commercial fields requiring novel properties of the colloids.

EXAMPLE 1

This example shows the general procedure of the novel electroless plating process. Acrylo-nitryl-butadiene-styrene (ABS) substrates (Monsanto PG Grey-229) were etched in a solution comprising 400 g/l $CrO_3$ and 350 g/l $H_2SO_4$ (conc.) for about 10 minutes at 70° C. Thereafter, the etched substrates were immersed in a colloidal catalytic dispersion for about five minutes at 40° C. The primed substrates were then rinsed and immersed in a developer solution comprising 0.5 g/l $NaBH_4$ for a few minutes. The substrates were rinsed and then immersed in an electroless copper bath operating at 40° C. and having the following composition:

| | |
|---|---|
| $CuSO_4 5H_2O$ | 15 g/l |
| EDTA (40%) | 68 g/l |
| NaOH | 9 g/l |
| NaCN | 3 ppm |
| Tergitol TMN | 0.2 (% wt.) |
| $H_2CO$ (37%) | 22 cc/l |

Final colloidal catalytic primer dispersion (working medium) was made by the dilution of premade concentrated stock; the latter was generally prepared via thermal aging or other equivalent conditions. while in these examples the substrates were pre-cleaned and etched using a wet chemical technique, other techniques of performing the preferred etching which are of a dry nature may be substituted and used in accordance to the present invention. A stabilized colloid (291 m) was prepared by the admixing of 12.2 g/l $Cu(NO_3)_2.3H_2O$, 12.2 g/l gelatin and sodium hydroxide in an amount representing twice the molar concentration of the copper ion. Prior to aging pH was adjusted to 9.0 and thereafter aging for about 16 hours was undertaken at 75° C.

| No. | Final Composition of Colloidal Catalytic Primer | Relative (%) Plating Coverage |
|---|---|---|
| 1a | Dilution (4×) of stock primer soln. with water | 0 |
| 1b | Same as above with 0.025M sodiumlaurylsulfate | 100 |
| 1c | Same as 1a with 0.025M sodiumdecylsulfate | 95 (average) |

Using the same final composition of catalytic primer as in 1a and 1b but including 0.27 g/l of $NaBH_4$ gave a plating coverage of 0% and 75% for media 1a and 1b respectively. While visually compositions 1a and 1b appeared the same, examination by an electron microscope at 150,00x showed a major difference in appearance. Specifically, the resulting colloid 1b exhibited a finer particle size (almost an order of magnitude) compared to the colloids of 1a. Similar observations were also noted in other cases. While I do not wish to be bound by theory, it is conceivable that the enhanced reactivity may be in part due to this noted change in particle size distribution. It should thus be recognized in the optimization of the process and solutions, plating coverage is dependent upon the reducing medium reactivity (e.g. concentration), nature and amount of added reactivity modifier, as well as the amount and nature of colloid stabilizer used in the preparation of the stabilized colloid as well as nature and reactivity of the electroless plating formulation and the stabilizers present within such bath.

EXAMPLE 2

It was also found that the present invention may be implemented in an alternative sequence of steps. For example, the compositions and substrates were all the same as in Example 1 while the following key steps were undertaken:

1. Immersion in the colloidal catalytic medium cited in Example 1, No. 1a followed by a water rinse; then
2. Immersion for 5 minutes in a surfactant solution composed of 0.025 M sodium laurylsulfate at 40° C. and rinse; then
3. Immersion for 5 minutes in 0.5 g/l $NaBH_4$ and rinse: finally
4. Immersion in the electroless copper formulation.

Results showed 90% metallic coverage. While the process shown in this example requires more steps in comparison to the process shown in example 1, its adaptation falls within the spirit of this invention. Using the above surfactant prior to the immersion into the stabilized colloidal solution did not produce any perceptible plating results.

It should thus be recognized that in using the reactivity modifier, two basic modes are possible. In the first mode, the reactivity modifier coexists along with the primary stabilizer in the dispersion, while in the second mode it is used subsequent to the step of the weakly active colloidal dispersion. Hence, as contemplated by the present inventor, both modes fall within the spirit of this invention.

EXAMPLE 3

Solutions, substrates and procedure were the same as in Example 1, except for the substitution of the following colloidal catalytic primer.

| No. | Final Working Composition of Colloidal Catalytic Primer | Relative (%) Plating Coverage |
|---|---|---|
| 3a | 3.1 g/l protective colloid* 0.005 M $Cu^{+2}$ pH final approx. 9.0 | 0 |
| 3b | Same as above with 0.025M Sodium dodecylsulfate (reactivity modifier) | 90 |

*The protective colloid used is an extracted and refined collagen protein and is designated as Fluid Colloid EX-3 sold by the Swift Chemical Company. The concentrate stock dispersion was prepared under standard laboratory conditions.

EXAMPLE 4

Catalytic solutions were prepared by the admixing of cobalt sulfate, water, a material(s) selected from lingosulfonates (derivative of lingnin) and sodium hydroxide. In a typical case (41-4) the catalytic solution was comprised of:

| | |
|---|---|
| $CoSO_4 \cdot 7H_2O$ | 14.3 g/l |
| Lingosulfonate | 12.5 g/l |
| pH (after hydroxide addition and aging) | about 7.9 |

Dilution of above with water (1:9) and utilization in the present process steps (as defined in Example 1) gave good metallic coverage. Similarly, nickel and copper catalytic solutions are prepared using any of several soluble salts and hydroxides.

EXAMPLE 5

A procedure similar to Example 1 was used. However, sodium alpha sulfonate was used as the reactivity modifier. Results showed a major improvement in the plating coverage.

EXAMPLE 6 (JP-70)

A procedure similar to Example 1 was used. However, a commercial alkaline electroless copper bath comprising formaldehyde was used at room temperature. The weakly active (control JP-39) colloid comprised the admixture with some thermal energy added.

| | |
|---|---|
| $CuSO_4 \cdot 5H_2O$ | 10.1 g/l |
| Gum Arabic | 12 g/l |
| $NaBH_4$ | 1.5 g/l |
| NaOH | 1.6 g/l |

Using the control followed by a rinse in 0.5 g/l $NaBH_4$ gave at best 50% metallic coverage. However, incorporating a sodium salt of polymerized alkyl naphthalene sulfonic acids at a concentration of 3.6 g/l to control resulted in 100% coverage.

EXAMPLE 7 (JP-84)

Control colloidal composition and procedure were the same as in example 6. To control 4 ml/l of absolute methanol was added as the reactivity modifier. Plating results after the incorporation of the reactivity modifier were 100% in coverage. Though methanol was used, other compounds containing hydroxy groups may be contemplated.

EXAMPLE 8 (CB-10)

A control (CB-10) colloidal composition comprised the admixture of:

| | |
|---|---|
| $CoCl_2 \cdot 6H_2O$ | 2.4 g/l |
| $CuSO_4 \cdot 5H_2O$ | 10.1 g/l |
| Gum Arabic | 12 g/l |
| $NaBH_4$ | 1.9 g/l |
| NaOH | 2.0 g/l |

The composition was mixed with added thermal energy.

0.96 g/l of dioctyl sodium sulfosuccinate was incorporated to the control. Using 0.3 g/l of dimethylamine borane (at 45° C. for 3 minutes) showed a significant improvement in the plating results. In this example I had found that the optimum cobalt to copper ratio must be determined for each individual composition; this can be accomplished by simple experiments obvious to those skilled in the art. In addition, while this phenomenon is not completely understood, it is anticipated that nickel and/or iron may be substituted for the cobalt since they are similar in their electronic structure.

In general, it was found that an excess of copper to cobalt (or nickel) is preferred.

EXAMPLE 9

A colloidal dispersion of the following admixture at a pH of 12.7 was prepared wherein the reaction was carried out above room temperature.

| | |
|---|---|
| $CuSO_4 \cdot 5H_2O$ | 9.96 g/l |
| $CoCL_2 \cdot 6H_2O$ | 2.38 g/l |
| NaOH | 7.52 g/l |
| $NaBH_4$ | 0.71 g/l |
| Sodium lignosulfonate | 12.0 g/l |

The resulting dispersion was tested in accordance with the procedure of Example 8. Results showed no plating. However, using the same composition with acid addition (e.g. sulfuric acid) to a final pH value of about 7.53 resulted in 100% metallic coverage. Accordingly, it should be recognized that pH adjustment(s) and, hence, those chemical additive(s) which are used to achieve said pH adjustment(s) are reactivity modifier(s) and their utilization falls within the spirit of this invention.

EXAMPLE 10

A composition similar to that in example 9 at a pH of 7.47 with added 0.2 g/l of mercaptobenzothiazole (MBT) was tested, followed by 0.1 g/l dimethylamine borane (at 45° C.) solution. Whereas the control plated 20% metallic coverage at best, the modified composition gave a plating coverage of 90 to 100%. The above testing was done at a pH of about 7.5. It is noted that MBT is a well known corrosion inhibitor which is adsorbed or absorbed onto metallic substrates. Hence, corrosion inhibitor(s) do fall within the spirit of this invention.

It is noted that while in most cases the reactivity modifier was added after the colloid was formed (nucleated), the invention is not limited to this sequence but is rather aimed at the final composition in which all the components including reactivity modifiers are present.

While it is generally preferred to admix the weakly active colloidal dispersion with the reactivity modifier, in an alternate approach, the reactivity modifier may be admixed with the primary stabilizer (which alone renders the colloids weakly active) prior to the colloid nucleation process.

EXAMPLE 11

A colloidal composition was prepared using the following chemicals. The colloidal phase was nucleated at about 55° C. In this composition, as discussed in a copending application, it is believed that a copper-tin interaction product is formed and final pH was adjusted to 5.0.

| | |
|---|---|
| $CuCl_2$ | 0.04M |
| $Sn(BF_4)_2$ | 0.081M |
| $NaBH_4$ | 0.076M |
| NaOH | 0.37M |
| Gelatin | 6 g/l |
| Daxad CP-1 (T.S. 34.4%)* | 0.1 ml/. |

*Daxad Cp-1, product of Grace Dewey & Almy Division of W.R. Grace & Co.

Comparison of the resulting product and the same without the CP-1 showed the former to have a greater activity as reflected in the adsorption onto an alumina ceramic substrate. The CP-1 (or reactivity modifier) was added along with the gelatin prior to the colloid formation.

From the above variety of reactivity modifiers used, it should be evident that the invention is not intended to be limited to any specific chemical class, but rather includes all materials which function as either stabilizer and/or adsorbants onto the colloid nuclei.

While I do not wish to be bound by theory, the following model is proposed for possible account of the phenomenon at hand. In the formation of highly stabilized colloidal dispersions, the colloidal nuclei (e.g. hydrous oxide of copper or alloy or an elemental state) are surrounded by a stabilizer(s) which is adsorbed onto said nuclei. It is probably the degree of adsorption and its consequent charge modifications which contribute to the stabilization mechanism and at the same time makes the colloidal nuclei sterically impervious to the chemical reaction with subsequent reducing agent; or a key component within the electroless plating bath (e.g. formaldehyde), especially when the latter are used in moderate reactivity (e.g., concentration of said reducing agent) required for economical plating processes.

Upon the transformation of the weakly active colloids, some removal of stabilizer(s) from the adsorbed layer takes place by a displacement reaction making the colloid nuclei more accessible to subsequent interaction with the reducing medium and hence increasing it reactivity in the plating process. It also appears that in some cases the weakly active colloids are transformed to particles of smaller size having a greater amorphous character.

It should be understood that although the term colloid stabilizer refers to various chemical compounds, the effectiveness of stabilizers is not necessarily the same; and thus a stabilizer in one system may be a reactivity modifier in another system.

Schematically, the following simple equilibrium reaction may represent the present findings with at least two colloid stabilizers.

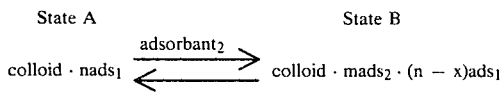

State A ⇌ (adsorbant₂) State B colloid · nads₁ ⇌ colloid · mads₂ · (n − x)ads₁ in which ads denotes adsorbant; n, m, x denotes some value. x could range from zero to some value.

Also ads₁ and ads₂ are chemically distinguishable. State A is a less reactive colloidal dispersion relative to State B. As aforesaid, the present invention is not bound to the proposed model and furthermore, in any of the states shown there may be more than one adsorbant as well as a multiplicity of colloids, having different metallic nature and/or morphology and/or of compounds and/or of alloys. In cases in which the primary stabilizer and the reactivity modifier are admixed prior to the colloidal nucleation, the product formed is the activated state.

It should be recognized that the present invention is not limited to the nature or specific reducing agent used in the process of plating. Moreover, this invention is also not limited to the use of a reducing agent in the developing or activating step of the procedure. It should also be obvious to those skilled in the art that compatible electroless formulations should be selected.

It has also been recognized that in using the processes according to U.S. Pat Nos. 3,993,799 or 3,993,491 or that of U.S. Pat. Nos. 3,772,056 and 3,772,078, some contamination into the reducing medium would take place with time. The nature of the contamination may be either ionic or colloidal as well as combinations thereof. It is further recognized that such contamination would tend to interact with the reducing medium accounting for some undesired homogenous decomposition.

It is therefore highly desirable to insure that such homogeneous decomposition catalyzed by metallic impurities be minimized. In meeting this objective, it is proposed that selective additives in controlled concentrations by incorporated in the reducing medium. Specifically, chelating (or complexing) agents should be incorporated for the complexion of metallic ions while strong colloidal stabilizers should be incorporated in the encapsulation of colloidal particles and hence result in their deactivation. It may further be necessary to add a combination of both types of materials (stabilizers), caution ought to be exercised in insuring that the reduction process is not disturbed. Thus, the concentration of said stabilizers should be controlled. The selection of potential colloid stabilizers should be evident from the present invention. For purposes of clarification, stabilizers incorporated in the reducing solutions are termed deactivators. Based upon the present teachings, it should be obvious that any of several electroless plating compositions may be substituted and used.

As heretofore pointed out, the modification of reactivity in accordance with the invention at times results in a substantial reduction of colloid particle size. This in and of itself has uses other than in electroless plating, (for example, as a thermal heat transfer composition which is particularly useful in solar energy convertors). The composition may be used with or without the added reactivity modifier.

In nucleating the colloids, soluble and insoluble compounds may be used as the starting compounds for the synthesis of the insoluble (colloidal) phase; the final working composition may then be dispersed in a suitable solvent.

It is further recognized that the present invention is particularly useful in printed circuitry fabrication and especially in through-hole metallization. Effective and active catalyst(s) is most useful in the reliability of through-hole metallization insuring good plating uniformity and without skip plating for electrical continuity.

It is also recognized that this invention is primarily concerned with aqueous dispersions for bath economy, pollution abatement, and performance.

What I claim is:

1. A process for electroless or chemical plating onto a nonconductor substrate comprising the step of contacting said substrate with an activated colloidal dispersion wherein said colloidal dispersion comprises a metal which in one of its oxidation states is capable of electroless or chemical plating initiation and wherein said metal may be in an elemental state or alloy or compound and mixtures thereof and further wherein said activated colloidal dispersion comprises at least one primary stabilizer which alone renders the dispersion weakly active and at least one reactivity modifier and wherein said primary stabilizer and said reactivity modifier are inherently colloid stabilizers however they are different materials and further wherein said reactivity modifier is a non-ionic surfactant.

2. The process according to claim 1 wherein said primary stabilizer is a secondary colloid.

3. The process according to claim 1 wherein the primary stabilizer and the reactivity modifier are admixed prior to the colloid nucleation process.

4. The process according to claim 1 wherein said metal is selected from the group consisting of copper, cobalt, nickel, palladium and iron.

5. The process according to claim 1 wherein said activated colloidal dispersion is positively charged.

6. The process according to claim 1 wherein said activated colloidal dispersion is negatively charged.

7. The process according to claim 1 further containing the step of metal deposition.

8. The process according to claim 1 wherein said primary stabilizer is a nonionic surfactant compound.

9. The process according to claim 1 wherein said non-conductor substrate is a printed circuitry type substrate.

10. The process according to claim 9 wherein said printed circuitry type substrate further contains through-holes.

* * * * *